(12) United States Patent
Shioga et al.

(10) Patent No.: US 7,745,924 B2
(45) Date of Patent: Jun. 29, 2010

(54) CAPACITOR EMBEDDED IN INTERPOSER, SEMICONDUCTOR DEVICE INCLUDING THE SAME, AND METHOD FOR MANUFACTURING CAPACITOR EMBEDDED IN INTERPOSER

(75) Inventors: Takeshi Shioga, Kawasaki (JP); Masataka Mizukoshi, Kawasaki (JP); Kazuaki Kurihara, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 176 days.

(21) Appl. No.: 12/129,889

(22) Filed: May 30, 2008

(65) Prior Publication Data

US 2009/0057827 A1 Mar. 5, 2009

(30) Foreign Application Priority Data

Aug. 30, 2007 (JP) .............................. 2007-224659

(51) Int. Cl.
*H01L 23/485* (2006.01)
(52) U.S. Cl. .............................. 257/700; 257/E23.141; 361/306.1
(58) Field of Classification Search ................. 257/532, 257/758, 691–692, 686, 700, 777, E23.141; 361/306.1
See application file for complete search history.

(56) References Cited

U.S. PATENT DOCUMENTS

| | | | |
|---|---|---|---|
| 5,455,064 A | 10/1995 | Chou et al. | |
| 6,853,051 B2 | 2/2005 | Shioga et al. | |
| 7,161,793 B2 | 1/2007 | Kurihara et al. | |
| 7,172,945 B2 | 2/2007 | Shioga et al. | |
| 7,227,736 B2 | 6/2007 | Shioga et al. | |
| 7,312,975 B2 * | 12/2007 | Togashi et al. | 361/321.1 |
| 7,355,836 B2 * | 4/2008 | Radhakrishnan et al. | 361/306.2 |
| 7,532,453 B2 * | 5/2009 | Yamamoto et al. | 361/306.2 |
| 7,580,240 B2 * | 8/2009 | Yamamoto et al. | 361/311 |
| 7,665,207 B2 * | 2/2010 | Fraley et al. | 29/834 |
| 2002/0117742 A1* | 8/2002 | Miyamoto et al. | 257/686 |
| 2004/0184219 A1 | 9/2004 | Otsuka et al. | |
| 2006/0175083 A1* | 8/2006 | Muramatsu et al. | 174/260 |
| 2009/0213526 A1* | 8/2009 | Hsu et al. | 361/306.1 |

FOREIGN PATENT DOCUMENTS

| | | |
|---|---|---|
| JP | 7-176453 A | 7/1995 |
| JP | 2001-35990 A | 2/2001 |
| JP | 2001-68583 A | 3/2001 |
| JP | 2003-197463 A | 7/2003 |
| JP | 2004-79801 A | 3/2004 |
| JP | 2004-214589 A | 7/2004 |
| JP | 2004-304159 A | 10/2004 |

\* cited by examiner

*Primary Examiner*—Nathan Ha
(74) *Attorney, Agent, or Firm*—Westerman, Hattori, Daniels & Adrian, LLP

(57) ABSTRACT

As for electrode pads for a semiconductor integrated circuit element, some of electrode pads for signal transmission are coupled to Ti films. Others of the electrode pads for signal transmission are coupled to electrode pads through wiring routed in multilayer wiring. Electrode pads for power supply are coupled to electrode pads to which power lines at potentials different from each other are coupled through wiring. The electrode pads are also coupled to Al foils (anodes). Electrode pads for grounding are coupled to electrode pads to which ground lines are coupled through wiring. The electrode pads are also coupled to conductive polymer films (cathodes).

15 Claims, 13 Drawing Sheets

CAPACITOR EMBEDDED IN INTERPOSER, SEMICONDUCTOR DEVICE INCLUDING THE SAME, AND METHOD FOR MANUFACTURING CAPACITOR EMBEDDED IN INTERPOSER

CROSS-REFERENCE TO RELATED APPLICATIONS

This application is based upon and claims the benefit of priority from the prior Japanese Patent Application No. 2007-224659, filed on Aug. 30, 2007, the entire contents of which are incorporated herein by reference.

BACKGROUND OF THE INVENTION

1. Field of the Invention

The present invention relates to a capacitor embedded in an interposer mounted immediately below a semiconductor integrated circuit element or the like, a semiconductor device including the same, and a method for manufacturing a capacitor embedded in an interposer.

2. Description of the Related Art

Along with the recent progress in CoC (Chip on Chip) technology, there has been proposed a technique for mounting a high-capacity memory chip and a logic chip on one semiconductor package substrate and implementing high-speed signal transmission between the memory chip and the logic chip. FIG. 9 is a schematic view showing a conventional semiconductor device.

In the conventional semiconductor device, for example, a multilayer wiring 109 is formed on a silicon substrate 101 to constitute an interposer. Semiconductor integrated circuit elements 122a and 122b including microscopic bumps (micro-bumps) are mounted on electrode pads on the multilayer wiring 109. One of the semiconductor integrated circuit elements 122a and 122b is a memory chip, and the other is a logic chip. An under-filling resin 126 is provided between the semiconductor integrated circuit elements 122a and 122b, and the multilayer wiring 109. A plurality of electrode pads for wires are also provided on the multilayer wiring 109, and wires 124, including a signal line, a power line, and a ground line, are connected to the electrode pads. The interposer is mounted on a package substrate (not shown), and the other ends of the wires 124 are connected to the package substrate. Since the semiconductor integrated circuit elements 122a and 122b are close to each other, this semiconductor device is capable of high-speed data transmission. The bit width increases with an increase in the number of microscopic bumps.

There has also been developed an interposer with embedded decoupling capacitors. If such an interposer is used, a decoupling capacitor is located immediately below a semiconductor integrated circuit element. Accordingly, the reduced length of a piece of wiring can be routed from a power supply terminal and a grounding terminal of the semiconductor integrated circuit element to the decoupling capacitor, and the inductance can be reduced (Japanese Patent Application Laid-Open Nos. 7-176453, 2001-68583, 2001-35990, and 2004-304159, hereinafter referred to as Patent Documents 1 to 4, respectively). There has further been proposed a technique for reducing the thickness of a capacitor insulating film in order to increase the capacitance of a decoupling capacitor (Japanese Patent Application Laid-Open Nos. 2003-197463, 2004-79801, and 2004-214589, hereinafter referred to as Patent Documents 5 to 7, respectively).

The semiconductor device shown in FIG. 9, however, needs the wires 124 to connect the interposer and the package substrate, and the speed at which a signal is transmitted through the wire 124 is not sufficient. Although studies are underway on a technique for forming a through via in a support substrate for an interposer, for example, the silicon substrate 101 and transmitting a signal between the interposer and a package substrate through the through via, such a technique is hard to implement. This is because the technique requires the process of forming through holes corresponding to microscopic bumps in the support substrate for the interposer at short intervals and filling each through hole with a conductor. Especially, in the techniques disclosed in Patent Documents 1 to 4, for example, a through via needs to be formed in a support substrate. It is thus necessary to form a through via by co-firing a conductor and ceramic or by forming a through hole in a silicon substrate, insulating inter-via portions, and then filling the hole with a conductor. These processes are extremely difficult and require significant cost.

In the techniques disclosed in Patent Documents 5 to 7, a noble metal material which is resistant to oxidation, such as Pt or Au, is required as the material for an electrode of a thin film capacitor. It is also necessary to introduce vacuum equipment such as a sputtering system intended to form a high dielectric film. Further, it needs to remove particles in order to improve yields of thin film capacitors. For these reasons, significant cost is required.

Large capacitances of decoupling capacitors are required to reduce noise in various semiconductor integrated circuit elements. This may have an assumption that a sufficient number of conventional multi-layered capacitors cannot mount on an interposer substrate in the future.

SUMMARY OF THE INVENTION

According to an aspect of an embodiment, there is a capacitor embedded in an interposer including a base; a conductor via embedded in said base and extending through said base from an upper surface to a lower surface; a capacitor provided on said base; a first wiring coupled to said conductor via; a second wiring coupled to an anode of said capacitor; a third wiring coupled to a cathode of said capacitor; an insulating layer covering said capacitor, said first wiring, said second wiring, and said third wiring; a first electrode pad on said insulating layer and coupled to said first wiring; a second electrode pad on said insulating layer and coupled to said second wiring; a third electrode pad on said insulating layer and coupled to said third wiring; a fourth wiring covered by said insulating layer; a fourth electrode pad on said insulating layer and coupled to one end of said fourth wiring; and a fifth electrode pad coupled to the other end of said fourth wiring to which one end of a wire is bonded, wherein potentials are respectively applied from above said base to said anode and cathode.

DETAILED DESCRIPTION OF THE PREFERRED EMBODIMENTS

Embodiments will be concretely described below with reference to the accompanying drawings.

First Embodiment

Figure 1:
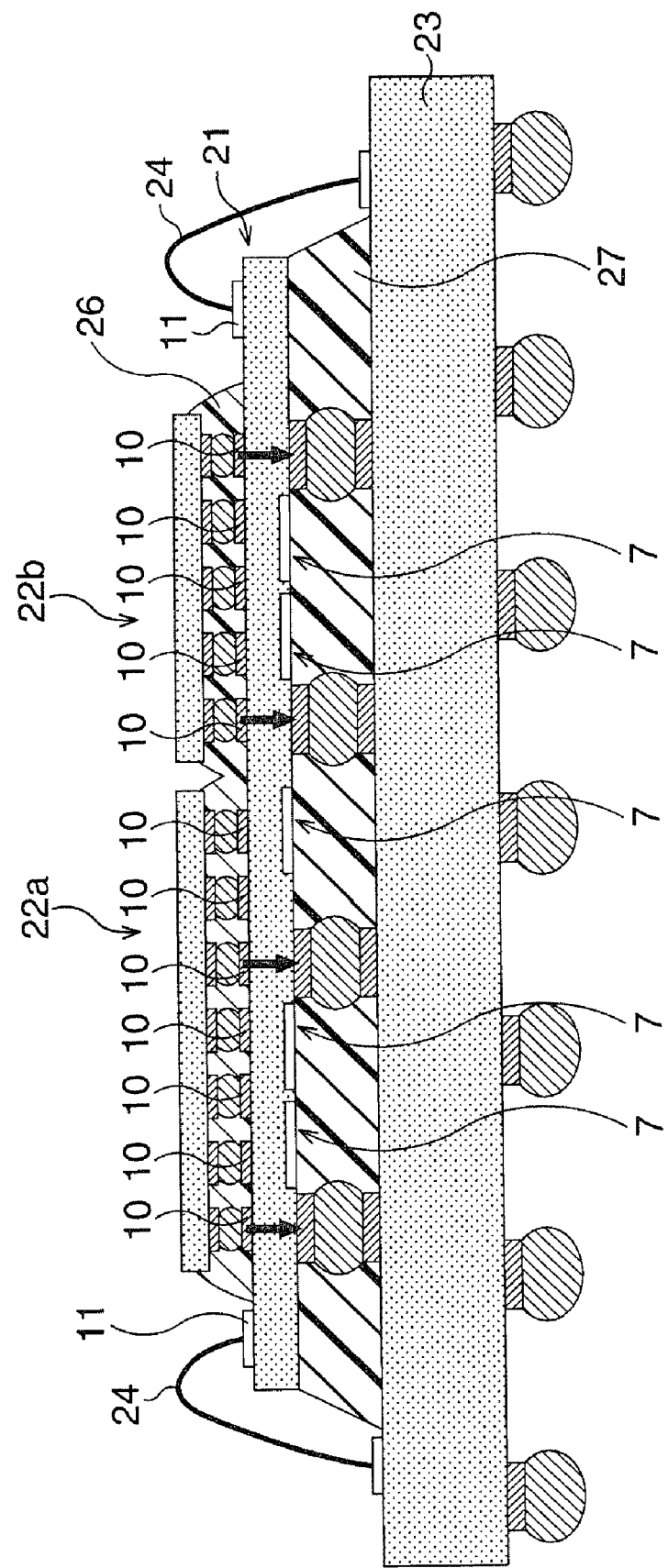
FIG. 1 is a schematic view showing a structure of a semiconductor device according to a first embodiment.

A first embodiment will be described first. FIG. 1 is a schematic view showing a structure of a semiconductor device according to the first embodiment.

In the first embodiment, a capacitor embedded in an interposer 21 including bumps is mounted on a package substrate 23, and the gap between the capacitor embedded in an interposer 21 and the package substrate 23 is sealed with an under-filling resin 27. The capacitor embedded in an interposer 21, which will be described in detail later, has a plurality of capacitor sheets 7 provided therein. Electrode pads 10 for a semiconductor integrated circuit element and electrode pads 11 for a wire are also provided in the capacitor embedded in an interposer 21. Semiconductor integrated circuit elements 22a and 22b including microscopic bumps are mounted on the electrode pads 10, and the gap between the semiconductor integrated circuit elements 22a and 22b and the capacitor embedded in an interposer 21 is sealed with an under-filling resin 26. Wires 24 are connected to the electrode pads 11. The other ends of the wires 24 are connected to electrode pads provided on the package substrate 23.

Figure 2:
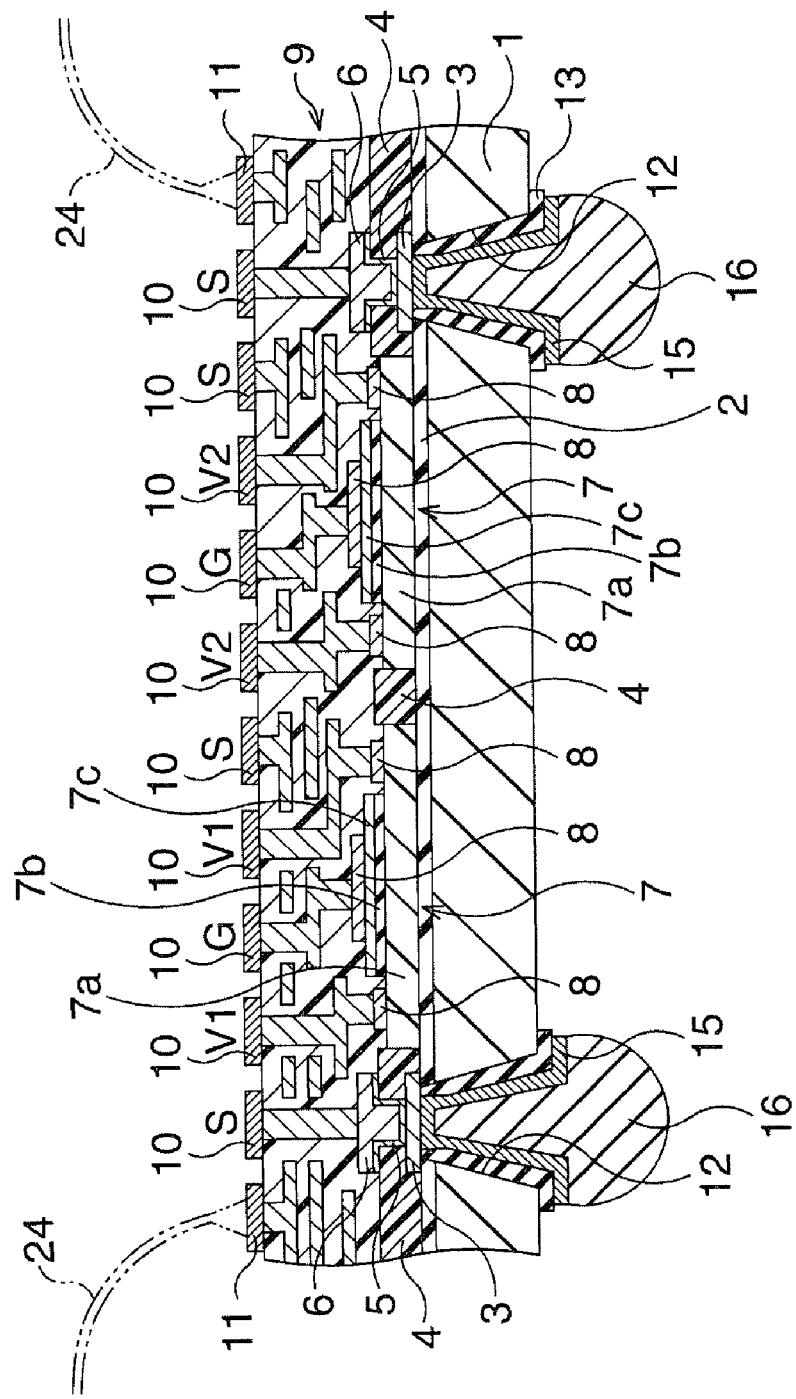
FIG. 2 is a sectional view showing a structure of a capacitor embedded in an interposer.

The details of the capacitor embedded in an interposer 21 will now be described. FIG. 2 is a sectional view showing a structure of the capacitor embedded in an interposer.

In the capacitor embedded in an interposer 21, a thermal oxide film 2 is formed on a silicon substrate 1 (base), and a plurality of Ti films 3 are formed as conductive stopper films on the thermal oxide film 2. A resin film 4 covering the Ti films 3 is formed. A plurality of openings for a capacitor are formed in the resin film 4, and the capacitor sheets 7 are attached to the thermal oxide film 2 in the openings. The capacitor sheet 7 includes an Al foil 7a, an anodic oxide film 7b, and a conductive polymer film 7c. Silver pastes 8 are coated on the Al foil 7a and conductive polymer film 7c. A plurality of openings for a signal wiring are also formed in the resin film 4, and a Cu film 5 and a Ni film 6 are formed in the opening. Multilayer wiring 9 is formed on these components. The electrode pads 10 for a semiconductor integrated circuit element (electrode pads S for signal transmission, electrode pads V1 and V2 for power supply, and electrode pads G for grounding) and the electrode pads 11 for a wire are provided on the multilayer wiring 9.

Through holes 12 are formed in the silicon substrate 1 and thermal oxide film 2 to reach the Ti film 3, and a silicon oxide film 13 is formed on the inner surface of the through hole 12. An under bump metal (UBM) 15 and a solder ball 16 are formed as a conductive via inside the silicon oxide film 13. The number of Ti films 3 is smaller than that of the electrode pads 10, and the number of through holes 12 is also smaller than that of the electrode pads 10.

As for the electrode pads 10 for a semiconductor integrated circuit element, some (first electrode pads) of the electrode pads S for signal transmission are connected to the Ti films 3. That is, these electrode pads S are connected to the solder balls 16. Note that each of these electrode pads S is located immediately above the Ti film 3 and conductive via and that a wiring therebetween (a first wiring) extends from the Ti film 3 and conductive via straight up to these electrode pad S. The others (fourth electrode pads) of the electrode pads S for signal transmission are connected to the electrode pads 11 (fifth electrode pads) through wirings (fourth wiring) routed in the multilayer wiring 9. The electrode pads V1 and V2 for power supply (second electrode pads) are connected to the electrode pads 11 (potential applying sections), to which power lines at potentials different from each other are connected, through wirings (second wirings) routed in the multilayer wiring 9. The electrode pads V1 and V2 are also connected to the Al foils 7a (anodes). The electrode pads G for grounding (third electrode pads) are connected to the electrode pads 11 (potential applying sections), to which ground lines are connected, through pieces of wiring (third pieces of wiring) routed in the multilayer wiring 9. The electrode pads G are also connected to the conductive polymer films 7c (cathodes).

Figure 3:
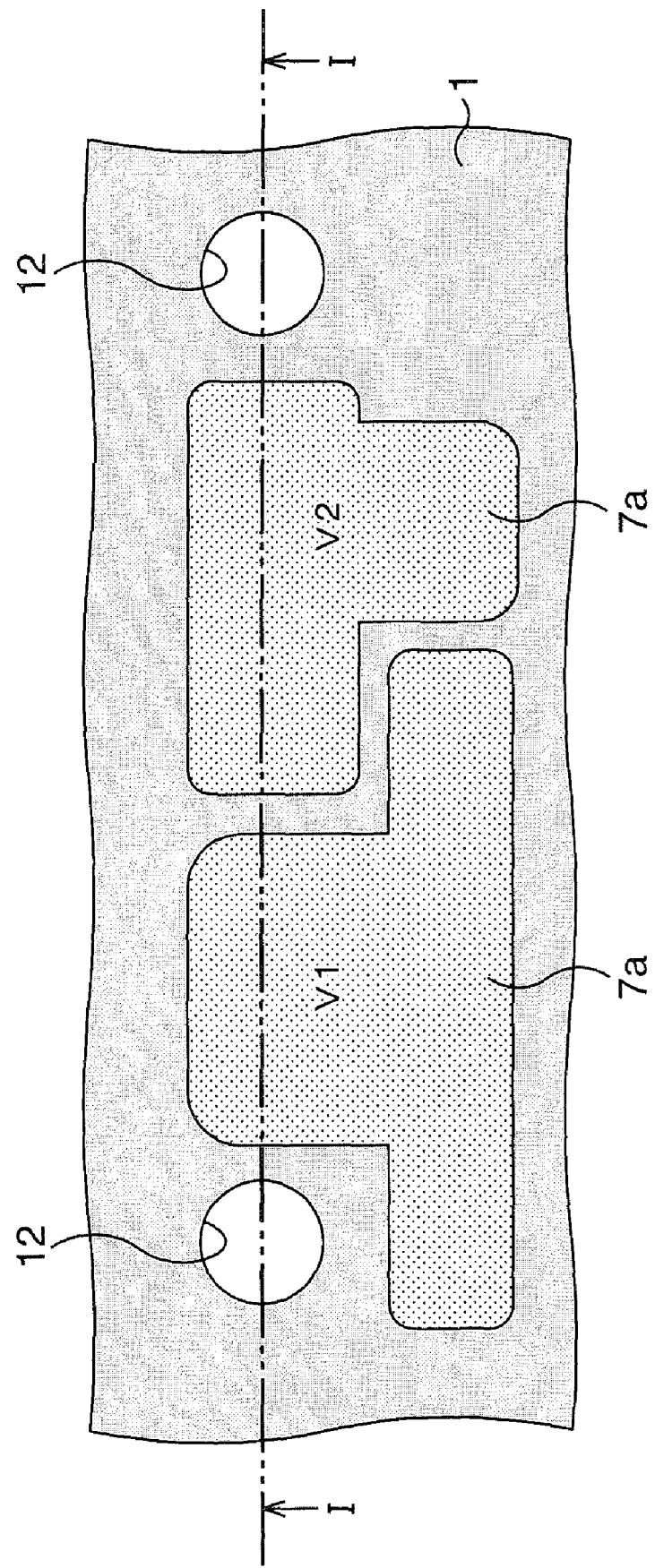
FIG. 3 is a schematic view showing a positional relationship between Al foils 7a and a silicon substrate 1.

FIG. 3 is a schematic view showing the positional relationship between the Al foils 7a and the silicon substrate 1 in the first embodiment. As shown in FIG. 3, the Al foil 7a to which the electrode pad V1 is connected and the Al foil 7a to which the electrode pad V2 is connected are placed apart from each other. Note that a section taken along the line I-I in FIG. 3 corresponds to FIG. 2.

For the microscopic bumps (terminals) of the semiconductor integrated circuit elements 22a and 22b, ones (signal terminals) to which signals are transmitted at a predetermined speed or higher (100 Mbps or more, for example) are connected to the electrode pads S connected to the Ti films 3. Others (second signal terminals) of the microscopic bumps to which other signals are transmitted are connected to the electrode pads S connected to the electrode pads 11. Ones for power supply (power supply terminals) of the microscopic bumps are each connected to the electrode pad V1 or V2 depending on a power supply voltage. Ones for grounding (grounding terminals) of the microscopic bumps are connected to the electrode pads G.

The other ends of the wires bonded to the electrode pads 11 are respectively bonded to the electrode pads provided on the package substrate 23. For example, ones for a signal of the wires are bonded to ones for a signal (seventh electrode pads) of the electrodes of the package substrate 23. The solder balls 16 are connected to other electrode pads (sixth electrode pads) provided on the package substrate 23.

In the semiconductor device (semiconductor package) with this configuration, high-speed signals in the semiconductor integrated circuit elements 22a and 22b are transmitted to the package substrate 23 through the solder balls 16. This eliminates transmission of high-speed signals through wires. Since the capacitor sheets 7 are located immediately below the semiconductor integrated circuit elements 22a and 22b, an increase in inductance is suppressed. The capacitance of each capacitor sheet 7 using the anodic oxide film 7b is extremely large, as will be described in detail later, and the capacitor sheet 7 can be easily formed.

Signals other than high-speed signals are transmitted to the package substrate 23 through the wires 24. Supply of a power supply potential and a ground potential is also performed through the wires 24. Accordingly, the through holes 12 need not correspond to all the microscopic bumps, and the number of through holes 12 is made smaller than that of electrode pads 10. This makes it possible to ensure, between the through holes 12, an interval longer than that between the electrode pads 10 and facilitates formation of through vias.

Figure 4:
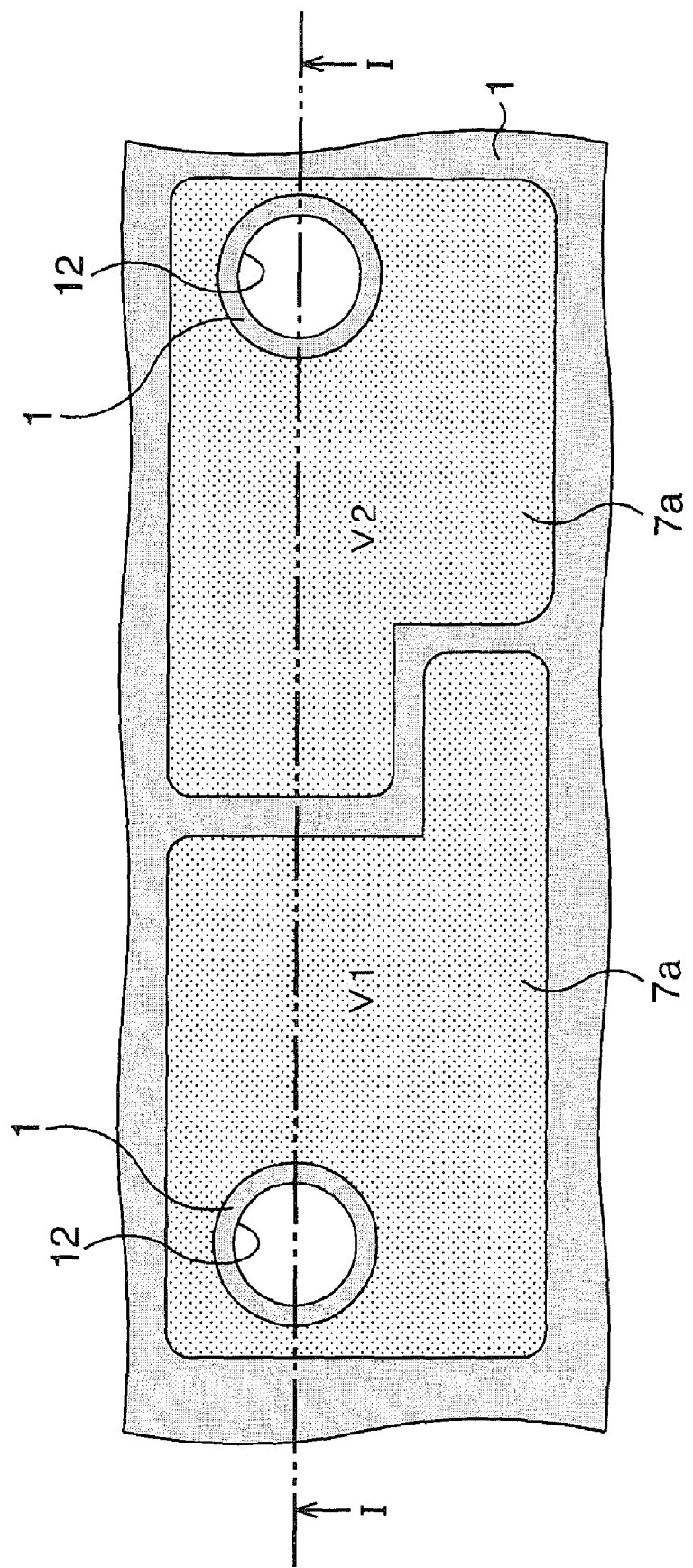
FIG. 4 is a schematic view showing another positional relationship between the Al foils 7a and the silicon substrate 1.

Note that the Al foils 7a may surround the through holes 12, as shown in FIG. 4. These Al foils 7a can be formed by punching or the like.

A method for manufacturing the capacitor embedded in an interposer 21 according to first embodiment will be described. FIGS. 5A to 5K are sectional views showing, in the order of steps, the method for manufacturing the capacitor embedded in an interposer 21 according to first embodiment.

Figure 5A:
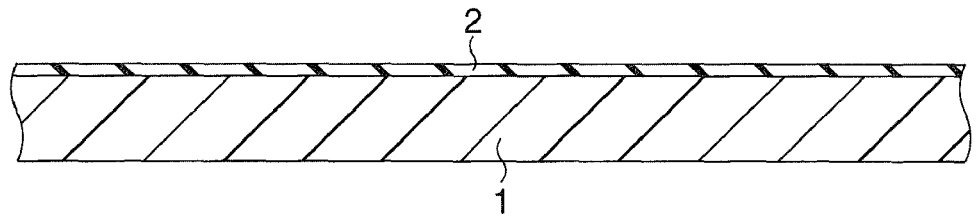
FIGS. 5A to 5K are sectional views showing, in the order of steps, a method for manufacturing a capacitor embedded in an interposer 21 according to the first embodiment.

As shown in FIG. 5A, the thermal oxide film 2 is first formed on the surface of the silicon substrate 1. A unit into which the silicon substrate 1 and thermal oxide film 2 have been integrated may be prepared.

Figure 5B:
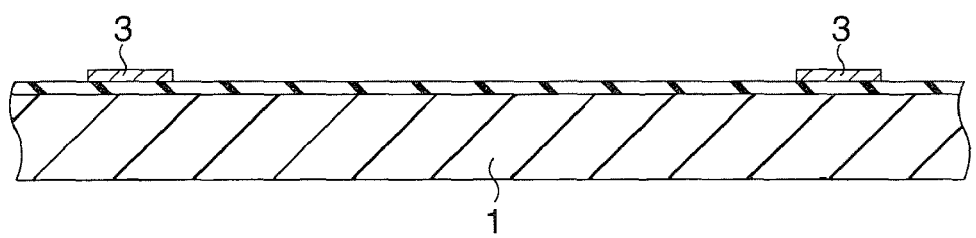

As shown in FIG. 5B, the plurality of Ti films 3 are formed on the thermal oxide film 2 by sputtering. Each Ti film 3 is located at a position where the solder ball 16 is to be formed. The thickness of the Ti film 3 is about 0.5 μm, for example. As described above, since the solder balls 16 are used only to transmit high-speed signals, the number of solder balls 16 is smaller than that of the electrode pads 10. The interval between the Ti films 3 is thus made longer than that between the electrode pads 10.

Figure 5C:
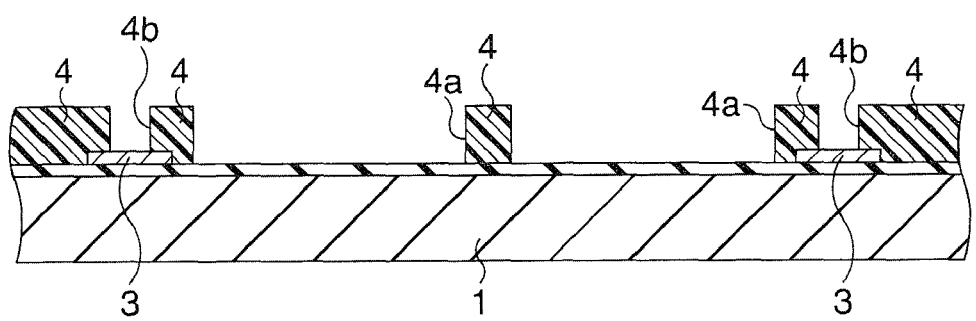

A film of photosensitive polyimide resin varnish covering the Ti films 3 is formed by a spin coat method. The spin coating is performed at a stage rotational speed of 1,500 rpm for 30 seconds, for example. The resultant thickness of the film is about 140 μm, for example. After that, the film is prebaked at about 100° C. Exposure and development are then performed, thereby forming openings for a capacitor and openings for a signal wiring. The film is baked at about 300° C. With this series of operations, the polyimide resin film 4 including openings 4a for a capacitor and openings 4b for a signal wire is formed, as shown in FIG. 5C. Note that the thickness of the polyimide resin film 4 is about 70 μm, for example.

Figure 5D:
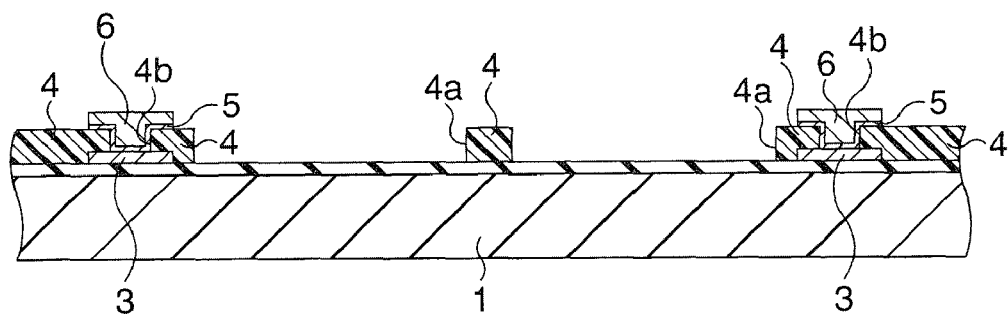

As shown in FIG. 5D, the Cu film 5 is formed over the surface by sputtering, and the Cu film 5 except for parts on the inner surfaces of and around the openings 4b is removed by etching. The Ni films 6 are formed by plating, using the remaining Cu film 5 as a seed layer. The thickness of the Ni films 6 is about 5 μm, for example.

Figure 5E:
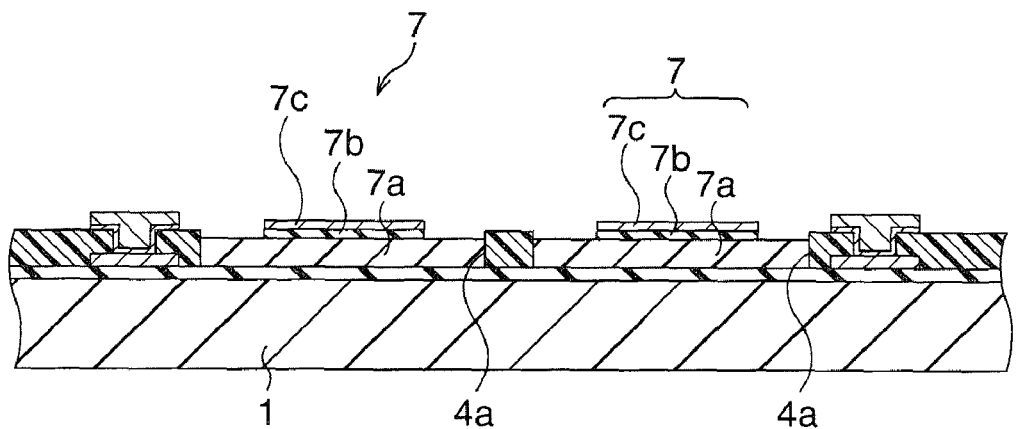

After that, as shown in FIG. 5E, the capacitor sheets 7 are attached in the openings 4a using an epoxy adhesive or the like. At this time, each capacitor sheet 7 is attached with the Al foil 7a (anodes) side down.

Figure 6A:
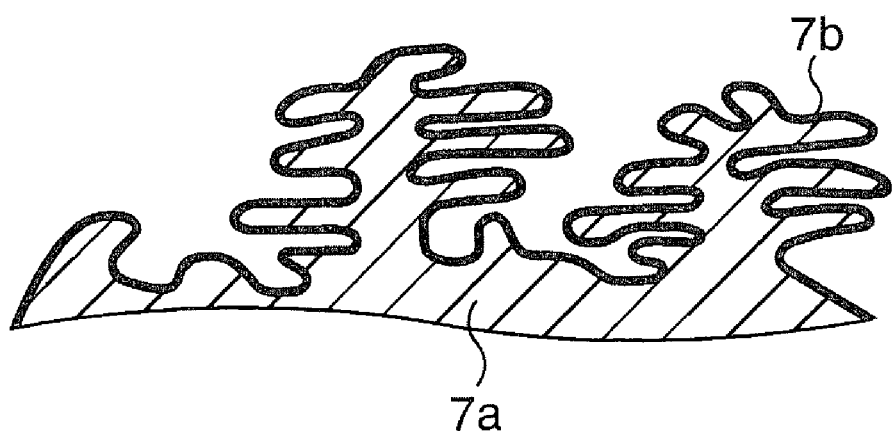
FIGS. 6A and 6B are sectional views showing, in the order of steps, a method for forming a capacitor sheet 7.
Figure 6B:
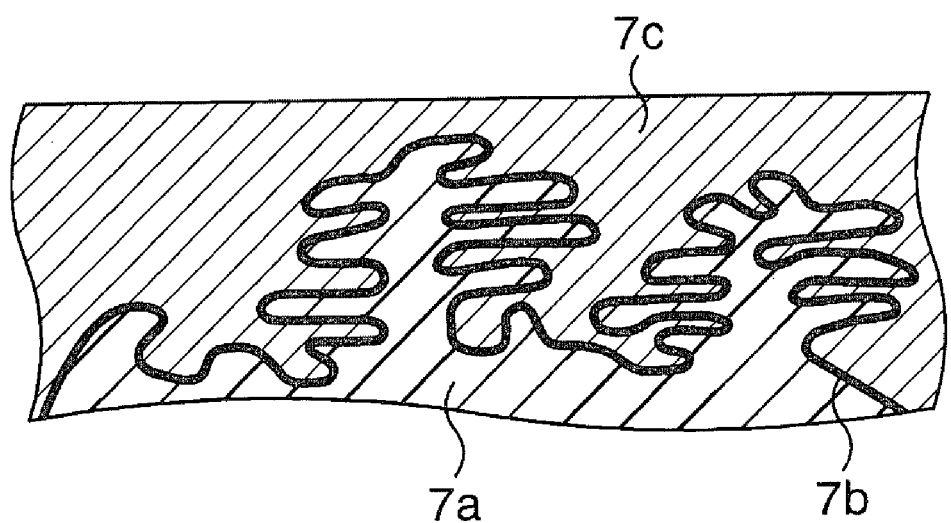

A method for forming the capacitor sheet 7 will be described. FIGS. 6A and 6B are sectional views showing, in the order of steps, the method for forming the capacitor sheet 7. The Al foil 7a is first subjected to etching (electrolytic etching, for example), thereby causing the surface of the Al foil 7a to have a porous structure. The Al foil 7a is then washed with fluorinated acid and distilled water. The Al foil 7a is subjected to anodization in an aqueous solution of ammonium adipate or ammonium pentaborate, thereby forming the anodic oxide film 7b, as shown in FIG. 6A. With this series of operations, microscopic asperities are formed at the surface of the Al foil 7a, and the anodic oxide film 7b is formed thereon. Accordingly, the effective surface area becomes extremely large. In the anodization, for example, an aqueous solution obtained by dissolving 150 g of ammonium adipate in 1,000 ml of pure water is used. The anodization is performed under the following conditions, for example: solution temperature, 85° C.; formation voltage, 100 V; current, 0.3 A; and voltage application time, 20 minutes. Note that electrolytic etching may be omitted and that only anodization may be performed.

After that, as shown in FIG. 6B, the conductive polymer film 7c made of polypyrrole, polyethylenedioxythiophene, or the like is formed on the surface of the anodic oxide film 7b. At the time of the formation of the conductive polymer film 7c, for example, the process of applying a solution containing polyethylenedioxythiophene and styrenesulfonic acid to the surface of the anodic oxide film 7b and drying the surface is repeated three times. The resultant thickness of the conductive polymer film 7c is about 20 μm. In this embodiment, the anodic oxide film 7b is used as a capacitor insulating film, the Al foil 7a is used as an anode, and the conductive polymer film 7c is used as a cathode. In the above-described manner, the capacitor sheet 7 is formed.

Figure 5F:
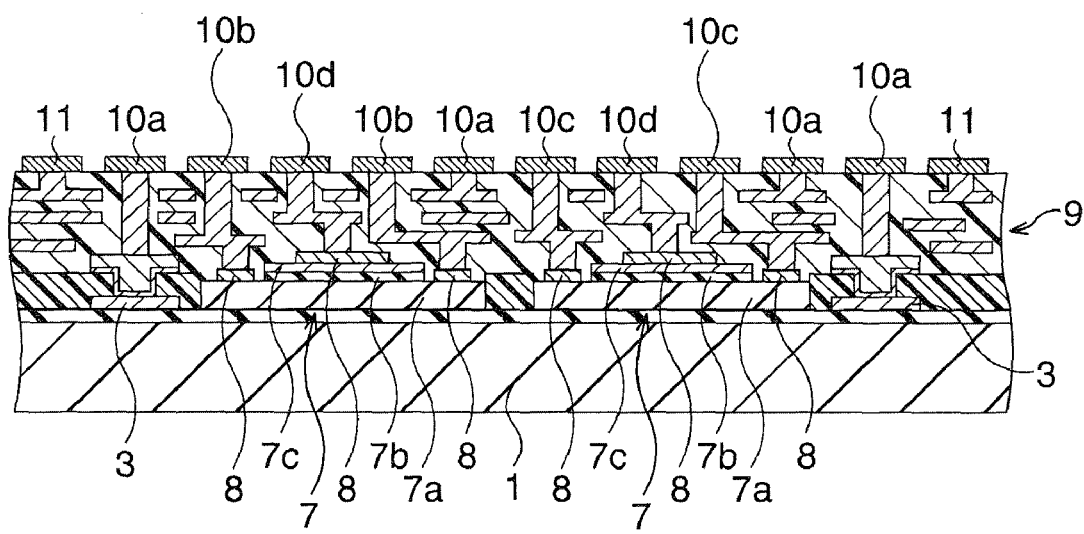

After the capacitor sheets 7 are attached, the Ag paste 8 is selectively applied to the Al foils 7a and conductive polymer films 7c, as shown in FIG. 5F. The multilayer wiring 9 is then formed on these components. At the time of the formation of the multilayer wiring 9, for example, a photosensitive polyimide film with a thickness of about 6 μm is used to form an insulating layer, and a Cu film with a thickness of about 3 μm is used to form a wiring layer. Electrode pads 10a for signal transmission, electrode pads 10b and 10c for power supply, and electrode pads 10d for grounding are formed on the multilayer wiring 9. The electrode pad 10a corresponds to the electrode pad S; the electrode pad 10b, the electrode pad V1; the electrode pad 10c, the electrode pad V2; and the electrode pad 10d, the electrode pad G. At the time of the formation of each of the electrode pads 10a to 10d, for example, a Ti film, a Cu film, and a Ni film are stacked in this order. At the time of formation of the electrode pads 11, for example, an Au film is formed.

Figure 5G:
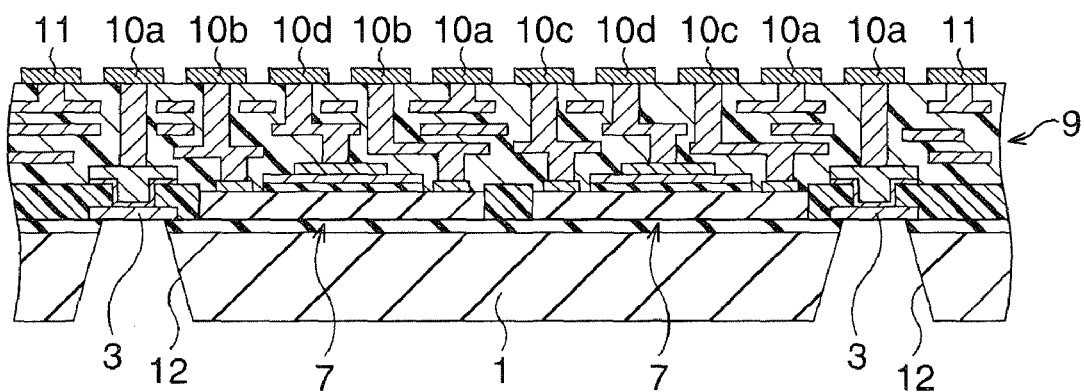

After that, the back surface of the silicon substrate 1 is polished, thereby reducing the thickness of the silicon substrate 1 to about 0.2 mm. As shown in FIG. 5G, the through holes 12 are formed in the silicon substrate 1 by a sandblasting method to reach the Ti films 3. At this time, each Ti film 3 functions as a stopper. Since the interval between the Ti films 3 is longer than that between the electrode pads 10a to 10d, the interval between the through holes 12 becomes long. Accordingly, the through holes 12 can be easily formed and are less prone to defects in spite of their inclined inner surfaces.

Figure 5H:
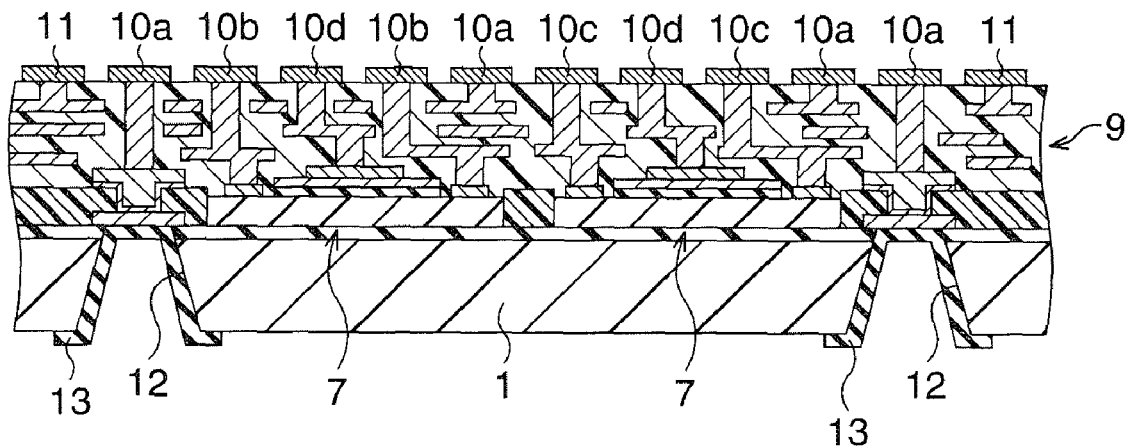

As shown in FIG. 5H, the silicon oxide film 13 is selectively formed by CVD on the inner surface and around each through hole 12. The thickness of the silicon oxide film 13 is about 0.07 mm, for example.

Figure 5I:
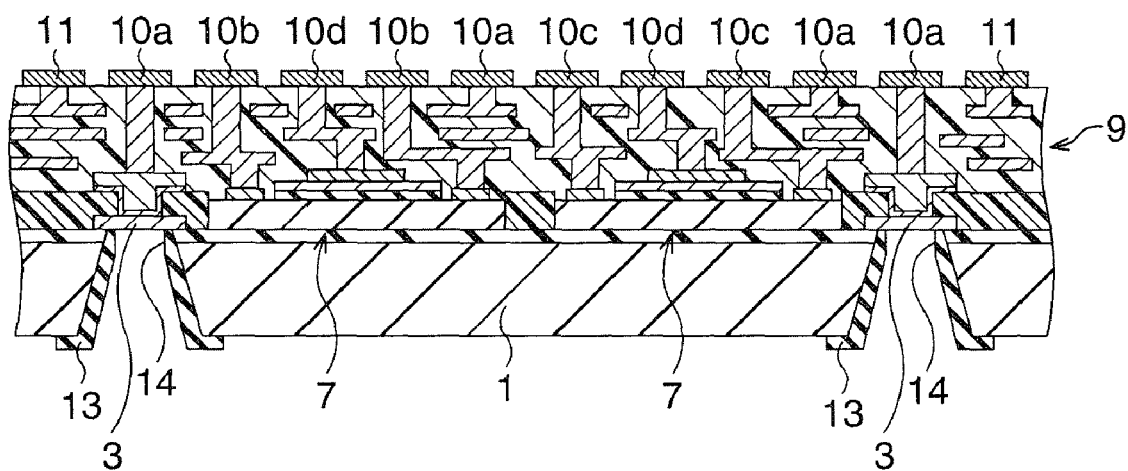

As shown in FIG. 5I, a part of the silicon oxide film 13 at the bottom of the through hole 12 is removed by etching. With this operation, an opening 14 is formed to expose the Ti film 3.

Figure 5J:
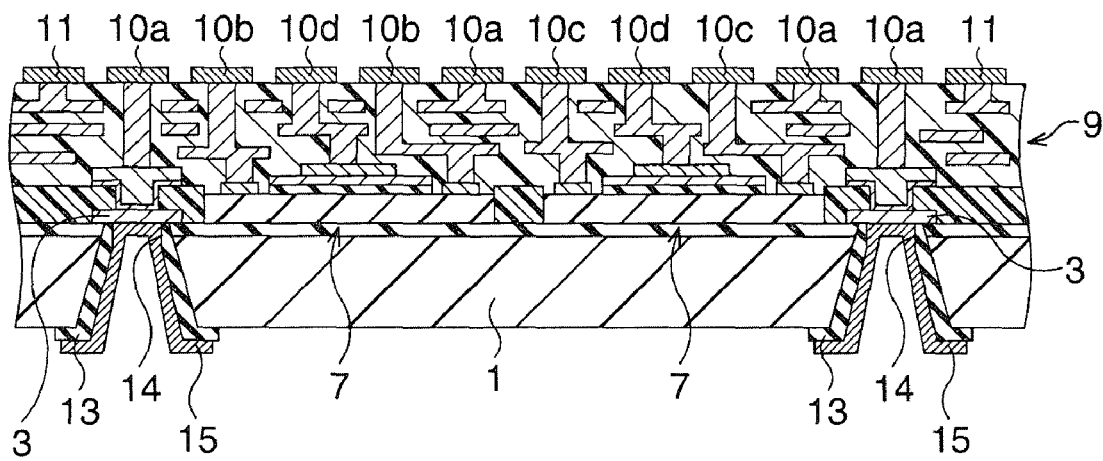
Figure 5K:
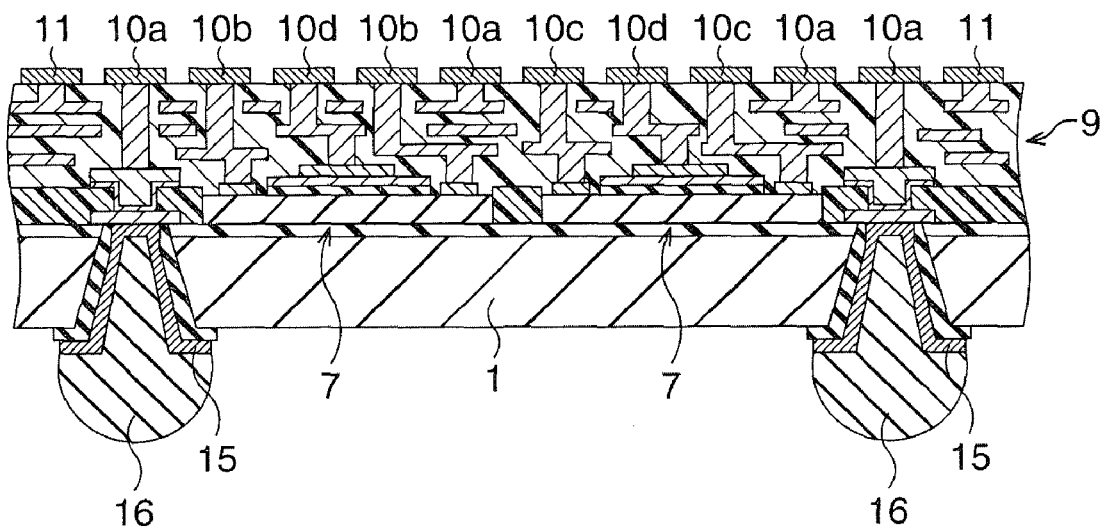

After that, as shown in FIG. 5J, the under bump metal (UBM) 15 is formed on an exposed part of the Ti film 3 and the silicon oxide film 13. At the time of the formation of the under bump metal 15, a Cr film and a Cu film are first formed in this order to form a seed layer. After that, Cu plating and Ni plating are applied using a resist mask. The resist mask is removed, and a part of the seed layer which has been covered with the resist mask is removed.

The solder ball 16 is then formed on the under bump metal 15 by plating. As the material for the solder ball 16, for example, Sn—Ag—Cu solder-type material is used.

In the above-described manner, the capacitor embedded in an interposer 21 can be manufactured.

Second Embodiment

A second embodiment will be described. In the second embodiment, an insulating film in a through hole 12 is different from that in the first embodiment. FIGS. 7A to 7E are sectional views showing, in the order of steps, a method for manufacturing a capacitor embedded in an interposer according to the second embodiment.

Figure 7A:
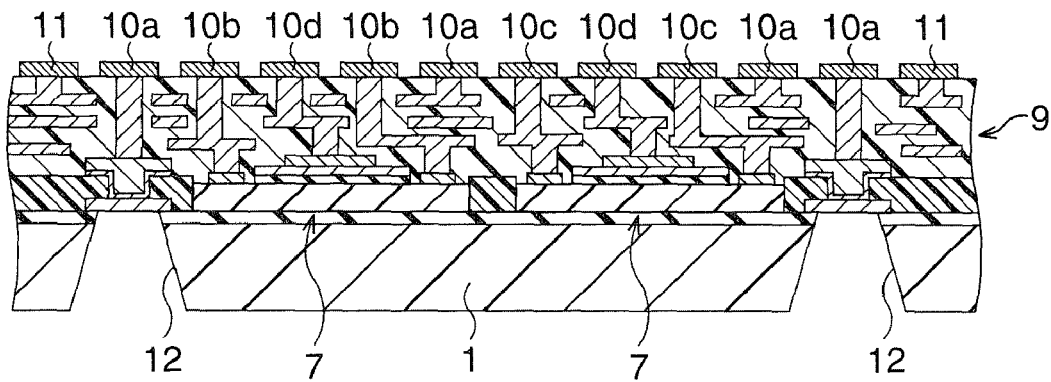
FIGS. 7A to 7E are sectional views showing, in the order of steps, a method for manufacturing a capacitor embedded in an interposer according to a second embodiment.

In the second embodiment, as shown in FIG. 7A, a series of processes leading up to formation of the through holes 12 is first performed in the same manner as in the first embodiment.

Figure 7B:
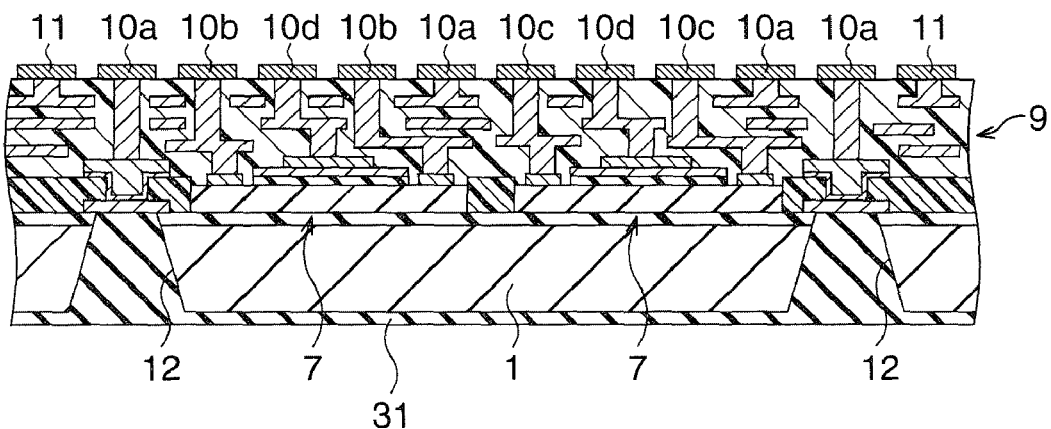

An organic resin sheet made of epoxy resin containing silica is pressed against the back surface of the silicon substrate 1 at a pressure of 0.6 MPa in a reduced atmosphere at 150° C. With this operation, an organic resin film 31 is formed to fill up the through holes 12, as shown in FIG. 7B.

Figure 7C:
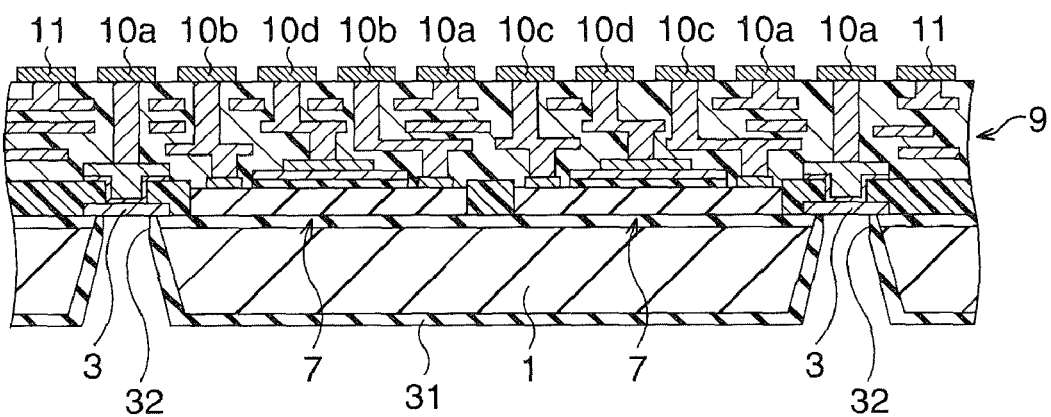

As shown in FIG. 7C, openings 32 are formed in the organic resin film 31 by laser beam machining to reach the Ti films 3.

Figure 7D:
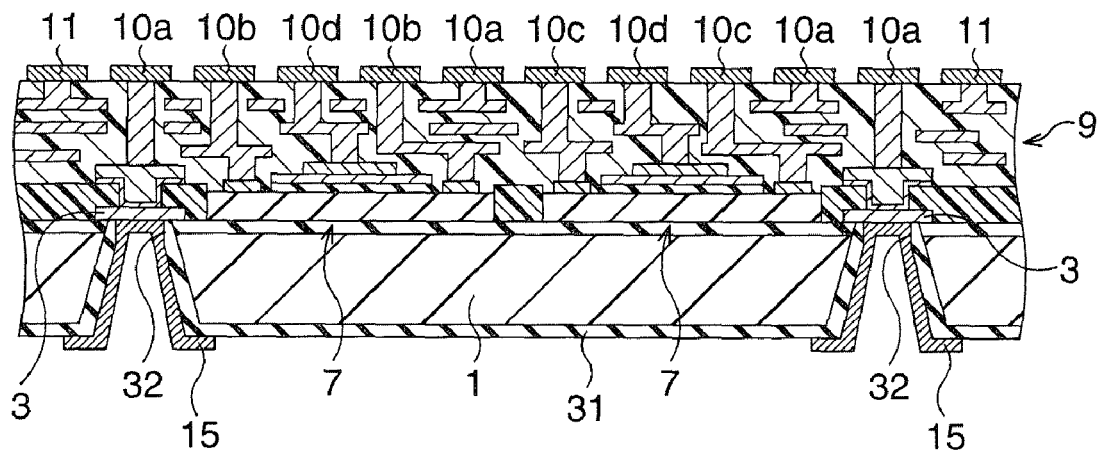
Figure 7E:
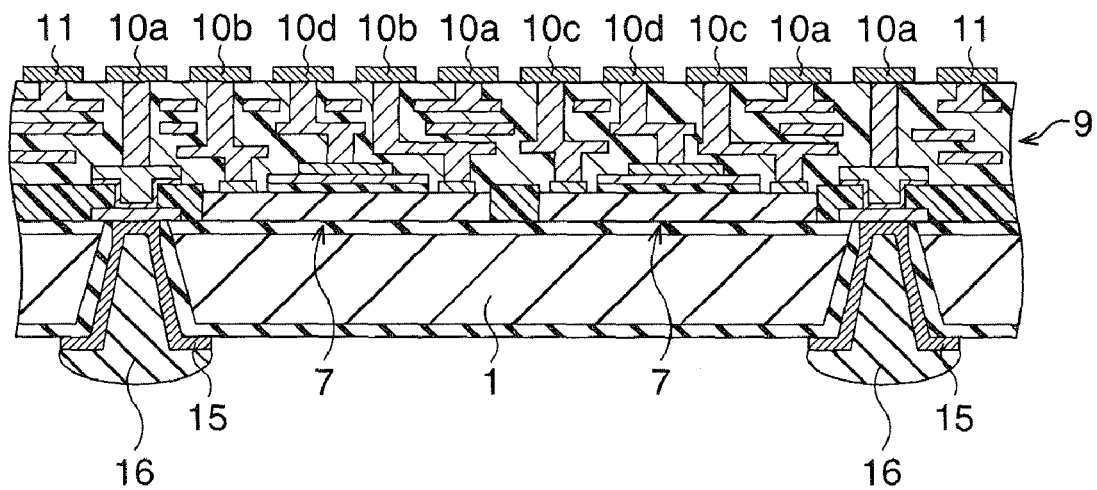

After that, as shown in FIG. 7D, the under bump metals 15 are formed in the same manner as in the first embodiment. As shown in FIG. 7E, the solder balls 16 are then formed in the same manner as in the first embodiment.

In the above-described manner, a capacitor embedded in an interposer can be manufactured.

Third Embodiment

Figure 8A:
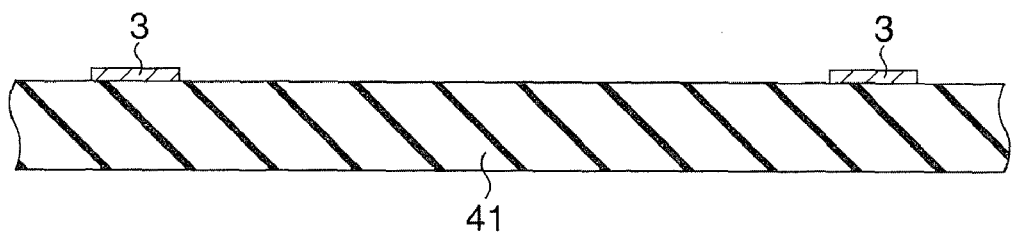
FIGS. 8A to 8C are sectional views showing, in the order of steps, a method for manufacturing a capacitor embedded in an interposer according to a third embodiment.
Figure 8B:
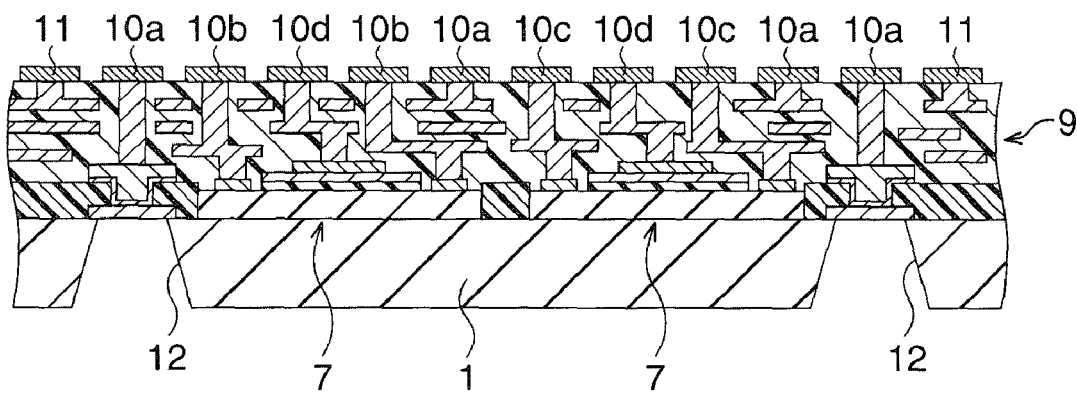
Figure 8C:
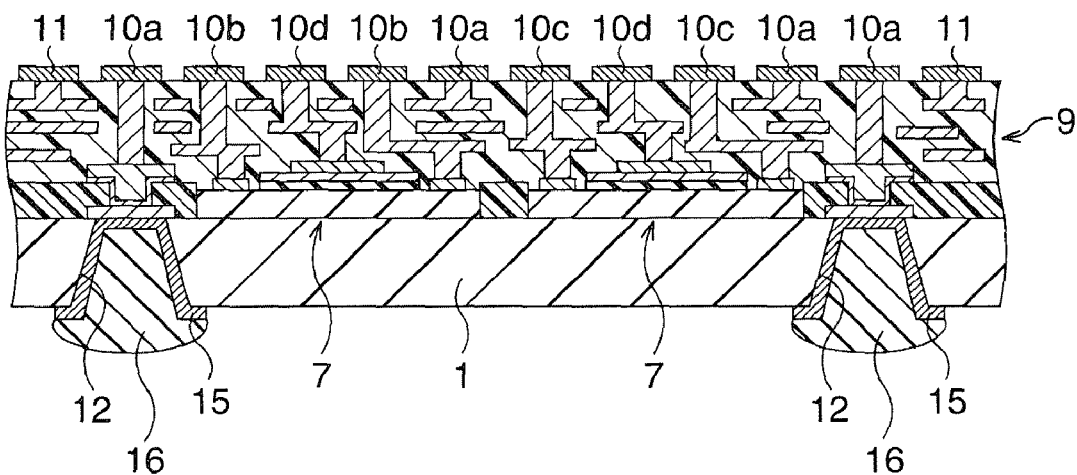
Figure 9:
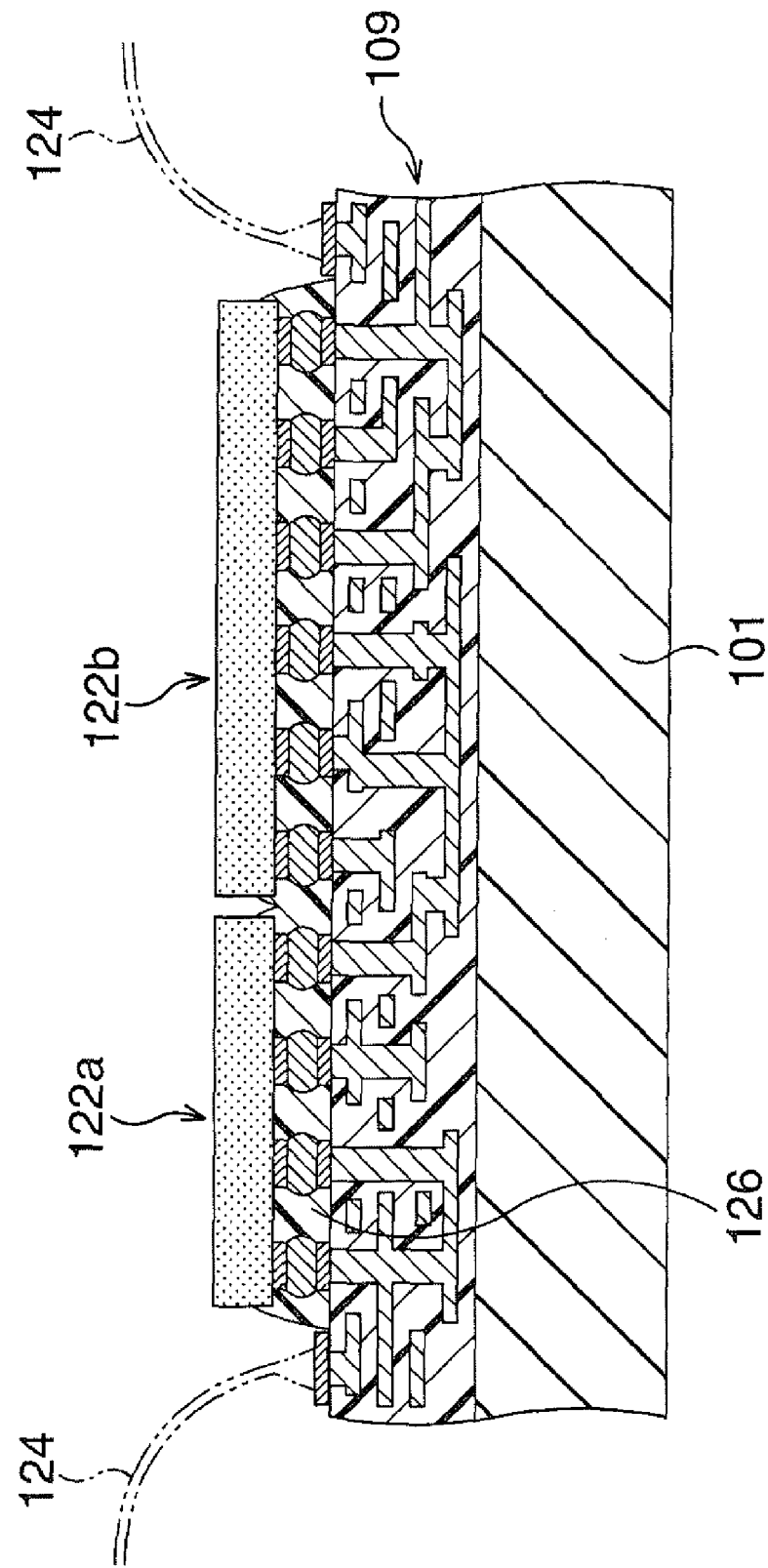
FIG. 9 is a schematic view showing a conventional semiconductor device.

A third embodiment will be described. In the third embodiment, the material for a substrate is different from that in the first embodiment. FIGS. 8A to 8C are sectional views showing, in the order of steps, a method for manufacturing a capacitor embedded in an interposer according to the third embodiment.

In the third embodiment, as shown in FIG. 8A, a plurality of the Ti films 3 are formed on a glass substrate 41 by sputtering. Note that Cr films with a thickness of about 0.05 μm may be formed before the formation of the Ti films 3.

As shown in FIG. 8B, a series of processes leading up to formation of the through holes 12 is performed in the same manner as in the first embodiment.

As shown in FIG. 8C, the under bump metal 15 and the solder ball 16 are then formed without forming an insulating film in each through hole 12.

In the above-described manner, a capacitor embedded in an interposer can be manufactured.

In the third embodiment, since the insulating glass substrate 41 is used as a substrate, it is unnecessary to form an insulating film inside the through hole 12. This reduces the number of steps.

Note that although in the above-described embodiments, Al is adopted as a valve metal, and an Al foil is used, a foil of another valve metal, such as a Ta foil, an Nb foil, a Ti foil, or a Si foil, may be used instead. Alternatively, a plate material may be used instead of a foil material. Especially if an Nb foil is used, the capacitance of a capacitor can be made further larger. This is because the dielectric constant of an Nb oxide is as very high as about 42 compared to the dielectric constant of about 8 of an Al oxide. If an Nb foil is used, anodization may be performed in an aqueous solution of phosphoric acid, for example. The anodization is performed under the following conditions, for example: solution temperature, 90° C.; formation voltage, 150 V; current, 0.6 A; and voltage application time, 10 minutes.

According to the present invention, it is possible to transmit a high-speed signal through a conductor via. Since potentials are respectively applied from above a base to the anode and cathode of a capacitor, the base does not need conductor vias for the anode and cathode. It is thus possible to transmit a signal at high speed while avoiding an increase in the complexity of a manufacturing process. Note that if a valve metal material is provided as the anode, an anodic oxide film formed on the valve metal material is provided as a capacitor insulating film of the capacitor, and a conductive material formed on the anodic oxide film is provided as the cathode, the anodic oxide film on the valve metal material with an extremely large effective area acts as the capacitor insulating film. This makes it possible to obtain a large capacitor capacitance. Since anodization does not need large vacuum equipment, the cost can be reduced.

What is claimed is:

1. A capacitor embedded in an interposer comprising:
a base;
a conductor via embedded in said base and extending through said base from an upper surface to a lower surface;
a capacitor provided on said base;
a first wiring coupled to said conductor via;
a second wiring coupled to an anode of said capacitor;
a third wiring coupled to a cathode of said capacitor;
an insulating layer covering said capacitor, said first wiring, said second wiring, and said third wiring;
a first electrode pad on said insulating layer and coupled to said first wiring;
a second electrode pad on said insulating layer and coupled to said second wiring;
a third electrode pad on said insulating layer and coupled to said third wiring;
a fourth wiring covered by said insulating layer;
a fourth electrode pad on said insulating layer and coupled to one end of said fourth wiring; and
a fifth electrode pad coupled to the other end of said fourth wiring to which one end of a wire is bonded,
wherein potentials are respectively applied from above said base to said anode and cathode.

2. The capacitor embedded in an interposer according to claim 1, wherein
a valve metal material is provided as said anode,
an anodic oxide film is provided on said valve metal material as a capacitor insulating film of said capacitor, and
a conductive material is provided on said anodic oxide film as said cathode.

3. The capacitor embedded in an interposer according to claim 2, wherein said conductive material is made of a conductive polymer material fitting in a recess of said anodic oxide film.

4. The capacitor embedded in an interposer according to claim 1, wherein said base is made of a glass material.

5. The capacitor embedded in an interposer according to claim 1, wherein said conductor vias are arranged at intervals longer than intervals between said first to third electrode pads.

6. The capacitor embedded in an interposer according to claim 1, wherein
said first electrode pad is located immediately above said conductor via, and
said first wiring extends straight up from said conductor via.

7. The capacitor embedded in an interposer according to claim 1, wherein, as said capacitors, at least two capacitors with anodes at different potentials are provided.

8. A semiconductor device comprising:
a capacitor embedded in an interposer; and
a semiconductor integrated circuit element mounted on said capacitor embedded in an interposer,
wherein
said capacitor embedded in an interposer includes:
a base;
a conductor via embedded in said base and extending through said base from an upper surface to a lower surface;
a capacitor provided on said base;
a first wiring coupled to said conductor via;
a second wiring coupled to an anode of said capacitor;
a third wiring coupled to a cathode of said capacitor;
an insulating layer covering said capacitor, said first wiring, said second wiring, and said third wiring;
a first electrode pad on said insulating layer and coupled to said first wiring;
a second electrode pad on said insulating layer and coupled to said second wiring;
a third electrode pad on said insulating layer and coupled to said third wiring;
a fourth wiring covered by said insulating layer;
a fourth electrode pad on said insulating layer and coupled to one end of said fourth wiring; and
a fifth electrode pad coupled to the other end of said fourth wiring to which one end of a wire is bonded,
potentials are respectively applied from above said base to said anode and cathode,
said semiconductor integrated circuit element includes:
a signal terminal coupled to said first electrode pad;
a power supply terminal coupled to said second electrode pad;
a grounding terminal coupled to said third electrode pad; and
a second signal terminal coupled to said fourth electrode pad, and
a speed at which a signal is transmitted through said wire is lower than a speed at which a signal is transmitted through said conductor via.

9. The semiconductor device according to claim 8, wherein
a valve metal material is provided as said anode,
an anodic oxide film is provided on said valve metal material as a capacitor insulating film of said capacitor, and
a conductive material is provided on said anodic oxide film as said cathode.

10. The semiconductor device according to claim 8, wherein the speed at which a signal is transmitted through said conductor via is not less than 100 Mbps.

11. The semiconductor device according to claim 8, wherein, as said semiconductor integrated circuit elements, at least two semiconductor integrated circuit elements with different structures are provided.

12. The semiconductor device according to claim 8, wherein, said capacitors, at least two capacitors with anodes at different potentials are provided.

13. The semiconductor device according to claim 9, wherein said conductive material is made of a conductive polymer material fitting in a recess of said anodic oxide film.

14. The semiconductor device according to claim 13, further comprising a package substrate including:
a sixth electrode pad to which said conductor via is coupled; and
a seventh electrode pad to which the other end of said wire is bonded.

15. The semiconductor device according to claim 8, wherein said conductor vias are arranged at intervals longer than intervals from the first to third electrode pads.

* * * * *